United States Patent
Demos et al.

(10) Patent No.: US 7,049,606 B2
(45) Date of Patent: May 23, 2006

(54) ELECTRON BEAM TREATMENT APPARATUS

(75) Inventors: Alexandros T. Demos, San Ramon, CA (US); Hari K. Ponnekanti, San Jose, CA (US); Jun Zhao, Cupertino, CA (US); Helen R. Armer, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 43 days.

(21) Appl. No.: 10/698,726

(22) Filed: Oct. 30, 2003

(65) Prior Publication Data

US 2005/0092935 A1 May 5, 2005

(51) Int. Cl.
*H01J 37/30* (2006.01)

(52) U.S. Cl. ............................ 250/492.2; 250/492.3; 250/398

(58) Field of Classification Search ........... 250/492.3, 250/492.2, 398; 315/307, 5.37
See application file for complete search history.

(56) References Cited

U.S. PATENT DOCUMENTS

| | | | | |
|---|---|---|---|---|
| 4,581,118 A | * | 4/1986 | Class et al. ............ 204/298.16 |
| 5,003,178 A | | 3/1991 | Livesay ................... 250/492.3 |
| 5,094,885 A | * | 3/1992 | Selbrede .................. 427/248.1 |
| 5,302,238 A | * | 4/1994 | Roe et al. ...................... 216/11 |
| 5,350,480 A | * | 9/1994 | Gray ...................... 156/345.26 |
| 5,421,888 A | * | 6/1995 | Hasegawa ................... 118/715 |
| 6,037,717 A | * | 3/2000 | Maishev et al. ........ 315/111.91 |
| 6,214,183 B1 | * | 4/2001 | Maishev et al. ........ 204/298.04 |
| 6,407,399 B1 | * | 6/2002 | Livesay ................... 250/492.3 |
| 6,417,111 B1 | * | 7/2002 | Nishikawa et al. ......... 438/710 |
| 2004/0089535 A1 | * | 5/2004 | Wolfe et al. ........... 204/192.12 |
| 2004/0099817 A1 | * | 5/2004 | Demos et al. ........... 250/492.3 |

* cited by examiner

*Primary Examiner*—Nikita Wells
*Assistant Examiner*—Johnnie L Smith, II
(74) *Attorney, Agent, or Firm*—Janah & Associates

(57) ABSTRACT

One embodiment of the present invention is an electron beam treatment apparatus that includes: (a) a chamber; (b) a cathode having a surface of relatively large area that is exposed to an inside of the chamber; (c) an anode having holes therein that is disposed inside the chamber and spaced apart from the cathode by a working distance; (d) a wafer holder disposed inside the chamber facing the anode; (e) a source of negative voltage whole output is applied to the cathode to provide a cathode voltage; (f) a source of voltage whose output is applied to the anode; (g) a gas inlet adapted to admit gas into the chamber at an introduction rate; and (h) a pump adapted to exhaust gas from the chamber at an exhaust rate, the introduction rate and the exhaust rate providing a gas pressure in the chamber; wherein values of cathode voltage, gas pressure, and the working distance are such that there is no arcing between the cathode and anode and the working distance is greater than an electron mean free path.

17 Claims, 3 Drawing Sheets

ELECTRON BEAM TREATMENT APPARATUS

TECHNICAL FIELD OF THE INVENTION

One or more embodiments of the present invention pertain to apparatus for treating films using an electron beam, and methods of operating such apparatus.

BACKGROUND OF THE INVENTION

Fabrication of integrated devices ("ICs"), for example, and without limitation, semiconductor ICs, is complicated and, because of increasingly stringent requirements on device designs due to demands for greater device speed, fabrication is becoming ever more complicated. Today's fabrication facilities are routinely producing devices having 0.13 µm feature sizes, and tomorrow's facilities soon will be producing devices having even smaller feature sizes.

For ICs having minimum feature sizes of 0.13 µm and below, problems of RC delay and crosstalk become significant. For example, device speed is limited in part by the RC delay which is determined by the resistance of metal used in an interconnect scheme and the dielectric constant of insulating dielectric material used between metal interconnects. In addition, with decreasing geometries and device sizes, the semiconductor industry has sought to avoid parasitic capacitance and crosstalk caused by inadequate insulating layer in the ICs. One way to achieve the desired low RC delay and higher performance in ICs involves using dielectric materials in the insulating layers that have a low dielectric constant ("low-k" materials). Such materials are fabricated by depositing a material having a low dielectric constant (for example, and without limitation, a carbon-doped oxide ("CDO")), and by treating the deposited material using an electron beam, for example, and without limitation, an electron beam provided by an electron beam treatment apparatus such as that disclosed in U.S. Pat. No. 5,003,178 (the '178 patent).

As the thickness of films such as, for example, and without limitation, dielectric films, decreases, the energy of electrons used to treat such films necessarily must decrease. For an electron beam treatment apparatus fabricated in accordance with the '178 patent, in order for the energy to decrease, a cathode voltage used to accelerate electrons generated in a generation and acceleration region between a cathode and an anode must also decrease. For example, for a 1 µm thick film having a density of about 1.3 gm/cm$^3$, the cathode voltage may be about 6.5 KV; for a 5000 Å thick film, the cathode voltage may be about 4 KV; and for a 2,500 Å thick film, the cathode voltage may be about 2 KV. However, we have found that for (i) a particular cathode-anode spacing, (ii) a particular value of electron beam current, and (iii) a particular type of gas in the apparatus; as the cathode voltage is reduced, the pressure of the gas in the electron beam treatment apparatus must increase. We believe this is so because: (a) as the cathode voltage is reduced, a larger number of ions is required to create enough electrons at the cathode to sustain the electron beam current; (b) a larger pressure is required to enable production of the larger number of ions; and (c) the yield of electrons from the cathode is lower at lower cathode voltage.

However, as taught by the '178 patent, cathode-anode spacing (also referred to in the '178 patent as a working distance) needs to be less than an electron mean free path in the gas to prevent breakdown (i.e., arcing or spark formation). As is known, the electron mean free path ($\lambda$): (a) is inversely proportional to gas pressure; and (b) it decreases as cathode voltage decreases. Thus, in accordance with the teaching of the '178 patent, to treat thinner films, the cathode voltage decreases, the pressure increases, and the working distance decreases. However, small working distances may become problematic in certain applications such as, for example and without limitation, applications wherein 300 mm wafers are treated and including such applications wherein the wafers are heated. In such applications, for small working distances, the anode may be so large that bowing or warping may become a problem.

In light of the above, there is a need for an electron treatment apparatus that can operate at working distances that are larger than the electron mean free path.

SUMMARY OF THE INVENTION

One or more embodiments of the present invention advantageously satisfy one or more of the above-identified needs in the art. In particular, one embodiment of the present invention is an electron beam treatment apparatus that comprises: (a) a chamber; (b) a cathode having a surface of relatively large area that is exposed to an inside of the chamber; (c) an anode having holes therein that is disposed inside the chamber and spaced apart from the cathode by a working distance; (d) a wafer holder disposed inside the chamber facing the anode; (e) a source of negative voltage whose output is applied to the cathode to provide a cathode voltage; (f) a source of voltage whose output is applied to the anode; (g) a gas inlet adapted to admit gas into the chamber at an introduction rate; and (h) a pump adapted to exhaust gas from the chamber at an exhaust rate, the introduction rate and the exhaust rate providing a gas pressure in the chamber; wherein values of cathode voltage, gas pressure, and the working distance are such that there is no arcing between the cathode and anode and the working distance is greater than an electron mean free path.

DETAILED DESCRIPTION

One or more embodiments of the present invention relate to electron beam treatment apparatus of the type disclosed in U.S. Pat. No. 5,003,178 (the '178 patent) that operate at values of cathode voltage, gas pressure, and working distance (i.e., a distance between the cathode and anode in a generation and acceleration region of the electron beam treatment apparatus) wherein the working distance exceeds an electron mean free path in the generation and acceleration region. As will be described in detail below, such values of cathode voltage, gas pressure, and working distance may be determined readily by one of ordinary skill in the art without undue experimentation. Co-pending patent application entitled "Improved Large Area Source for Uniform Electron Beam Generation" filed Nov. 21, 2002, Ser. No. 10/301,508 (which co-pending patent application and the present patent application are commonly assigned) is incorporated by reference herein.

Figure 1:
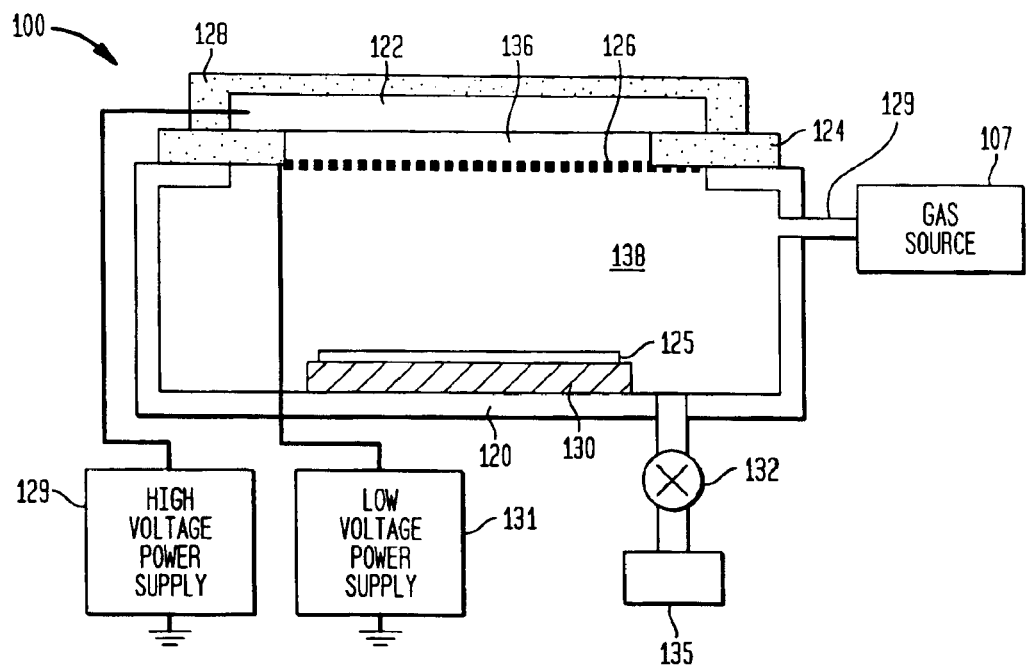
FIG. 1 shows an electron beam treatment apparatus that is fabricated in accordance with one embodiment of the present invention.

Apparatus: FIG. 1 shows electron beam treatment apparatus 100 that is fabricated in accordance with one embodiment of the present invention. As shown in FIG. 1, electron beam treatment apparatus 100 includes vacuum chamber 120; large-area cathode 122 (for example, and without limitation, a cathode having an area in a range from about 4 square inches to about 700 square inches); anode 126; and wafer or substrate holder 130. As further shown in FIG. 1, anode 126 is disposed between substrate holder 130 (located in ionization region 138) and cathode 122. Anode 126 is disposed at a working distance from cathode 122 that (as will be described in further detail below in the section entitled "Operation") is determined in accordance with one or more embodiments of the present invention.

As shown in FIG. 1, electron source 100 further includes: (a) high-voltage insulator 124 that is disposed between cathode 122 and anode 126 and is operative to isolate cathode 122 from anode 126; (b) cathode cover insulator 128 that is located outside vacuum chamber 120 to provide electrical protection for users; (c) gas manifold 127 has an inlet that is fabricated in accordance with any one of a number of methods that are well known to those of ordinary skill in the art to provide a mechanism for admitting gas into vacuum chamber 120 at a particular input rate from source 107; (d) variable leak valve 132 that is connected to vacuum pump 135 (vacuum pump 135 may be any one or a number of commercially available vacuum pumps capable of pumping vacuum chamber 120 from atmospheric pressure to a pressure in a range between about 1 mTorr to about 200 mTorr), which vacuum pump 135 exhausts gas from chamber 120 to control pressure inside vacuum chamber 120; (e) variable, high-voltage power supply 129 that is connected to cathode 122; and (f) variable, low-voltage power supply 131 that is connected to anode 126.

In accordance with one or more embodiments of the present invention, a high voltage (for example, a negative voltage between about −500 V and about −30 KV or higher) is applied to cathode 122 from variable, high-voltage power supply 129. In accordance with one embodiment of the present invention, high-voltage power supply 129 may be a Bertan Model #105-30R power supply manufactured by Bertan of Hicksville, N.Y., or a Spellman Model #SL30N-1200X 258 power supply manufactured by Spellman High Voltage Electronics Corp. of Hauppage, N.Y. Variable, low-voltage power supply 131 (for example, a d.c. power supply capable of sourcing or sinking current) is utilized to apply a voltage to anode 126 that is positive relative to the voltage applied to cathode 122. For example, the voltage applied to anode 126 may range from about 0 V to about −500 V. In accordance with one embodiment of the present invention, low-voltage power supply 131 may be an Acopian Model #150PT12 power supply available from Acopian of Easton, Pa.

A wafer or substrate to be treated, such as substrate 125, is placed on wafer or substrate holder 130. In accordance with one or more embodiments of the present invention, substrate 125 may be heated by a heating apparatus (not shown for case of understanding the present invention) such as, for example, and without limitation, a resistive heater disposed within wafer or substrate holder 130 in accordance with any one of a number of methods that are well known to those of ordinary skill in the art, or one or more infrared lamps disposed to irradiate substrate 125 in accordance with any one of a number of methods that are well known to those of ordinary skill in the art. Some of the radiation output from lamps in an embodiment that utilizes lamps to provide a heating mechanism may be reflected within chamber 120 to anode 126, and continual exposure of anode 126 to such radiation may cause anode 126 to overheat and fracture. Accordingly, in accordance with one or more such embodiments of the present invention, an internal portion of vacuum chamber 120 may be bead blasted, darkened, roughened, or anodized to reduce the coefficient of reflection of the internal portion of the chamber to be less than about 0.5. In this manner, a portion of the radiation output from the lamps may be absorbed by the internal portion of vacuum chamber 120.

Wafer or substrate holder 130 may be placed at a relatively large distance, such as, for example, and without limitation, 10 to 30 mm, from anode 126 to prevent electrons from casting an image of anode 126 in wafer 125. Irradiation of wafer 125 may further entail sweeping the electron beam back and forth across wafer 125 by using, for example and without limitation, a time-varying magnetic field produced by deflection coils surrounding vacuum chamber 120 as shown in FIG. 3 of the '178 patent.

Figure 2:
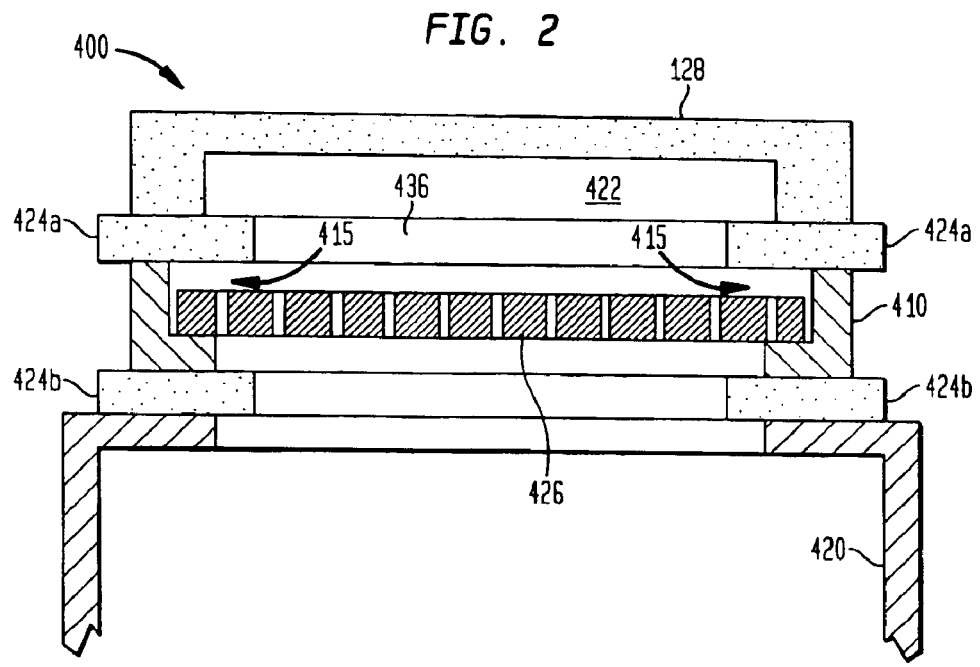
FIG. 2 shows a partial cross sectional view of an electron beam treatment apparatus that is fabricated in accordance with one embodiment of the present invention.

FIG. 2 shows a partial cross sectional view of electron beam treatment apparatus 400 that is fabricated in accordance with one embodiment of the present invention. As shown in FIG. 2, electron beam treatment apparatus 400 includes: (a) vacuum chamber 420; (b) large-area cathode 422; (c) upper insulator 424a; (d) lower insulator 424b; and (e) shelf 410 disposed between upper insulator 424a and lower insulator 424b. Anode 426 is positioned on shelf 410 across vacuum chamber 420 so that space 415 is defined above anode 426 and around a perimeter of anode 426. Advantageously, in this manner, anode 426 is free to move in space 415 to reduce stress associated with expansion and contraction of anode 426 caused by temperature change. In one such embodiment, anode 426 floats, i.e., it is not mechanically attached to shelf 410.

In accordance with one or more embodiments of the present invention, anode 126 of electron beam treatment apparatus 100 and/or anode 426 of electron beam treatment apparatus 400 may be fabricated (in whole or a surface thereof) from a electrically conductive material such as, for example, and without limitation, Al, Ti, Ni, Si, Mo, graphite, W, Co, and alloys of the foregoing. For treating films at relatively high temperatures, for example, temperatures in a range between about 200° C. and about 600° C., aluminum may provide a more suitable material than graphite. For example, aluminum generally has a higher thermal conductivity than graphite, and as a consequence, an anode formed from aluminum may bow less at high temperatures than one formed from graphite. In addition, aluminum has a lower emissivity than graphite, and this leads to lower heat transfer to the anode by radiation (for example, from wafer 125). For example, at a treatment temperature of about 400° C., the temperature of a graphite anode might rise to about 225° C. whereas the temperature of a comparably located aluminum anode might rise to only about 100° C. In further addition, aluminum has a lower sputtering yield than graphite, thereby resulting in less contamination on wafer 125. It should be noted that in addition to anode 126 being made from aluminum, cathode 122 and vacuum chamber 122 may also be made from aluminum. However, the surface of cathode 122 may also be fabricated from Al, Ti, Ni, Si, Mo, graphite, W, Co and alloys of the foregoing.

Anode 126 may be, for example, and without limitation, a grid, a mesh or a plate having an array of holes disposed therethrough. For example, in accordance with one or more embodiments of the present invention, the size of the holes may be varied to compensate for a decrease in beam intensity that sometimes occurs at an edge of anode 126. In this manner, a more diametrically uniform electron beam may be generated.

Figure 3A:
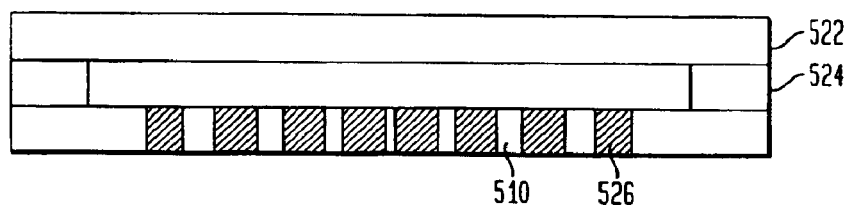
FIGS. 3A and 3B show cross sectional views of an anode with an array of holes that is fabricated in accordance with one embodiment of the present invention.
Figure 3B:
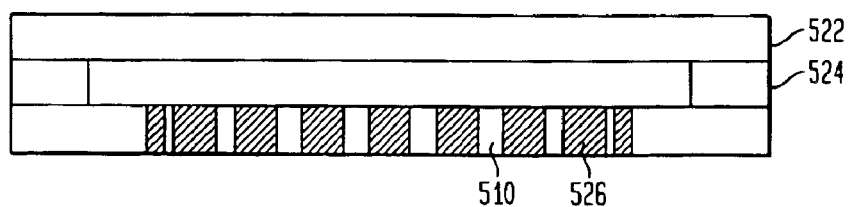

FIG. 3A shows an embodiment of anode 526 that includes an array of holes 510 whose diameter gradually increases from a center of anode 526 to an edge of anode 526. FIG. 3B shows a another embodiment of anode 576 that includes an array of holes 560 whose diameter gradually decreases from a center of anode 576 to the edge of anode 576. Examples for the array of holes and methods for making the holes are described in more detail in U.S. Pat. No. 6,407,399 which patent is incorporated by reference herein.

Figure 4:
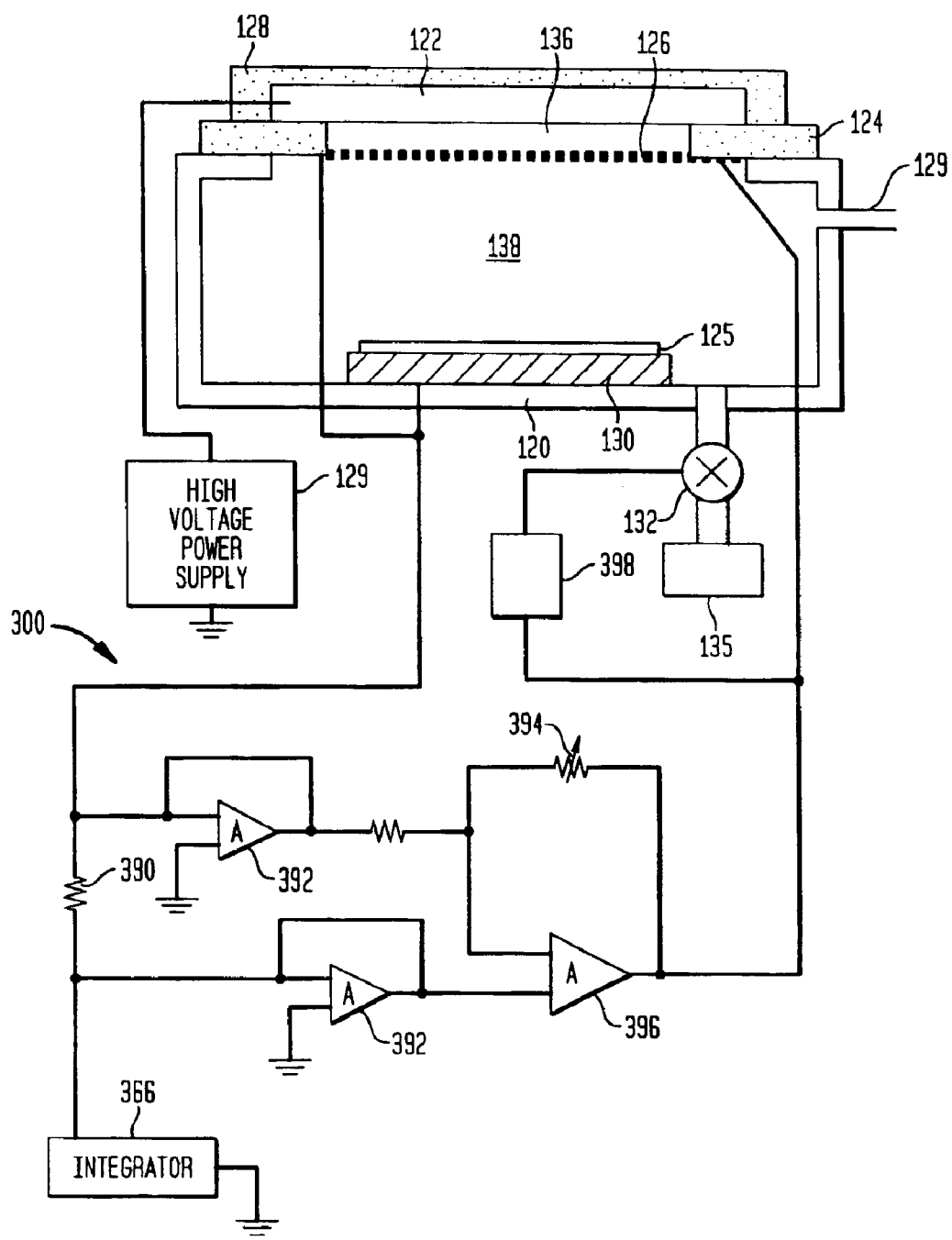
FIG. 4 shows the electron beam treatment apparatus of FIG. 1 further including a feedback control circuit.

FIG. 4 shows electron beam treatment apparatus 100 of FIG. 1 further including feedback control circuit 300. In some applications it may be desirable to provide constant beam current at different electron beam energies. For example it may be desirable to treat an upper layer of a film formed on a substrate, but not a bottom layer. This may be accomplished by utilizing an electron beam whose energy is low enough so that most of the electrons in the beam are absorbed in the upper layer. Subsequent to treating the upper layer, it may be desirable to treat the upper and lower layers of the film. This may be done by raising the accelerating voltage of the electron beam to enable it to penetrate completely through the film. Feedback control circuit 300 is configured to alter the accelerating voltage applied to cathode 122 while maintaining a constant electron beam current. As shown in FIG. 4, feedback control circuit 300 includes integrator 366 and sense resistor 390, sense resistor 390 is placed between wafer holder 130 and integrator 366 to sample the electron beam current. Alternatively, the electron beam current could be sampled at grid anode 126 since a portion of the electron beam is intercepted there. As further shown in FIG. 4, two unity gain voltage followers 392 buffer a signal obtained across sense resistor 390, and feed it to amplifier 396 having variable gain resistor 394. The output of amplifier 396 controls the voltage on grid anode 126 such that an increase in electron beam current will cause a decrease in bias voltage applied to grid anode 126. The gain of amplifier 396 may be adjusted by adjusting variable gain resistor 394 so that any change in current caused by a change in the accelerating voltage is counteracted by a change in bias voltage applied to anode 126, thereby maintaining a constant electron beam current. Alternatively, the output of amplifier 396 may be connected to voltage controlled, variable leak valve controller 398 to control variable leak valve 132 to counteract changes in emission current by raising or lowering the pressure in ionization region 138. Further, electron beam current control could also be provided by utilizing feedback signals to variable leak valve controller 398 and to grid anode 126.

Figure 5:
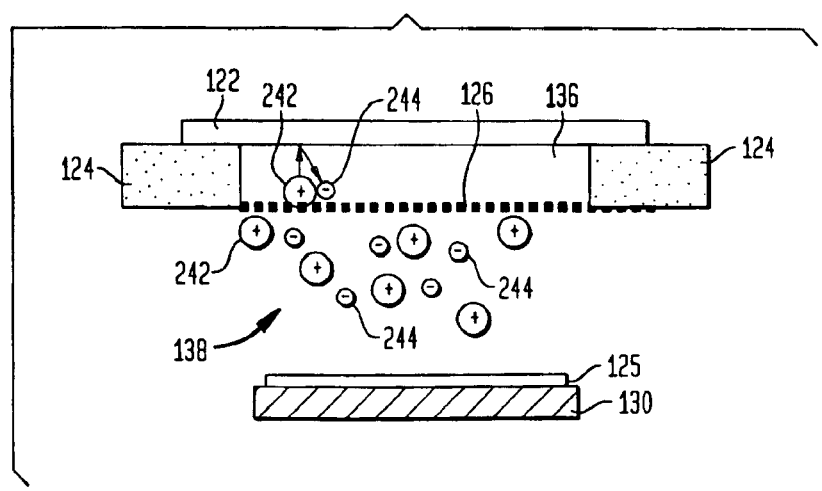
FIG. 5 shows a fragmentary view of the electron beam treatment apparatus of FIG. 1 which helps to illustrate some details of its operation.

Operation: FIG. 5 shows a fragmentary view of electron beam treatment apparatus 100 of FIG. 1 which helps to illustrate some details of its operation. To initiate electron emission in electron beam treatment apparatus 100, gas in ionization region 138 between anode 126 and wafer holder 130 must become ionized. In accordance with one or more embodiments of the present invention, the gas may include one or more of, for example, and without limitation, helium, argon, nitrogen, hydrogen, oxygen, ammonia, neon, krypton, and xenon. The step of ionizing the gas may be initiated by naturally occurring gamma rays, or it may be initiated by a high voltage spark gap disposed inside vacuum chamber 120 in accordance with any one of a number of methods that are well known to those of ordinary skill in the art.

Anode 126 is negatively biased by a voltage in a range, for example, from about 0 V to about −500 V that is applied thereto from low-voltage power supply 131. Once ionization is initialized, as shown in FIG. 5, positive ions 242 are attracted toward negatively biased anode 126. These positive ions 242 pass through holes in anode 126 into electron generation and acceleration region 136 between cathode 122 and anode 26. In region 136, positive ions 242 are accelerated toward cathode 122 as a result of a voltage (for example, a voltage in a range from about −500 V to about −30 KV or higher) that is applied thereto from high-voltage power supply 129. Upon striking the surface of cathode 122, positive ions 242 produce electrons 244 that are accelerated back toward anode 126. Some of electrons 244 strike anode 126, but many pass through anode 126, and continue on to impinge upon wafer 125 disposed on wafer or substrate holder 130. In addition, some of electrons 244 ionize gas molecules in ionization region 138.

As taught by the '178 patent, the working distance between cathode 122 and anode 126 is less than a mean free path of electrons 244 in generation and acceleration region 136 to prevent unstable arcing or high voltage breakdown. As is further taught by the '178 patent, this restriction on working distance enables the presence of positive ions in generation and acceleration region 136 to be controlled by voltage applied to anode 126. This, in turn, enables electron emission, and hence, electron beam current, to be controlled continuously from very small current to very large current by varying the voltage applied to anode 126. As is still further taught by the '178 patent, electron emission, and hence, electron beam current, can also be controlled by using variable leak valve 132 to adjust the gas pressure in vacuum chamber 120 (raising or lowering the gas pressure, raises or lowers, respectively, the number of molecules in ionization region 138 and generation and acceleration region 136). However, due to the relatively slow response time entailed in adjusting gas pressure in vacuum chamber 120, it may be better to adjust the gas pressure initially to produce a nominal electron beam current, and then to adjust the voltage applied to anode 126 to further control electron beam current. Thus, in designing an electron beam treatment apparatus in accordance with the teaching of the '178 patent, the working distance between cathode 122 and anode 126, must be small enough so that it is less than the electron mean free path determined by the lowest desired cathode voltage and associated gas pressure for a particular treatment application.

Despite the teaching of the '178 patent, we have discovered that one can sustain arc-free operation of electron beam treatment apparatus 100 at values of cathode voltage, gas pressure, and working distance wherein the working distance exceeds the electron mean free path in generation and acceleration region 136. For example, we have been able to operate the e-beam treatment apparatus without arcing at a cathode voltage of 2 KEV at electron beam currents of 3 ma and above: (a) at pressures above 70 mTorr at a working distance of 10 mm; (b) at pressures above 45 mTorr at a working distance of 15 mm; and (c) at pressures above 40 mTorr at a working distance of 20 mm. In light of this, and in accordance with one or more embodiments of the present invention, one may increase the working distance to values greater than the electron mean free path. In fact, the working distance may be increased to values that are, in accordance with one or more embodiments of the present invention, (as will be described in detail below) consistent with obtaining no arcing or breakdown in generation and acceleration region 136. Advantageously, our discovery enables one to utilize; (a) values of cathode voltage that are small enough to be useful in treating thin films; (b) values of gas pressure that are high enough to sustain electron beam current at such small values of cathode voltage; and (c) values of working distance that provide sufficient working tolerances to mitigate, for example, and without limitation, problems caused by heating of chamber elements such as anode 126.

The ability to utilize higher gas pressures in accordance with one or more embodiments of the present invention is advantageous for several reasons. First, a gas such as helium requires higher gas pressures to sustain electron beam current since helium has an ionization potential of 24 V, and as such, requires more ions to be generated to sustain operation. Second, the user of lighter gases such as, for example, helium and hydrogen require higher gas pressures to sustain the electron beam current since their ions produce relatively fewer electrons from impact on cathode 122 than heavier gases such as, for example, argon. For example, for a cathode voltage of 4 KV, an electron beam current of 4 mA (a particular value of electron beam current is typically determined to provide reasonable treatment throughput), and an electron dose of 100 µC/cm$^2$, a typical value of gas pressure for argon might be 35 mTorr whereas a comparable value of gas pressure for helium might be 160 mTorr. Note that the use of lighter gases such as, for example, helium and hydrogen may be advantageous over a heavier gas such as, for example, argon in some treatment applications for several reasons. First, ions of the lighter gases may cause less sputtering from anode 126, and thereby, reduce contamination of wafer 125 being treated. Second, ions of the lighter gases may transfer less energy by impact to wafer 125 being treated. Third, the use of a gas such as hydrogen may be advantageous in some applications by adding a chemical effect to the treatment such as, for example, by completing dangling bonds.

In accordance with one or more embodiments of the present invention, appropriate conditions of operation of electron beam treatment apparatus 100 or 400 entail utilizing values of cathode voltage, gas pressure, and working distance such that voltage breakdown does not occur, and the working distance is greater than the electron mean free path. The following describes how such values of cathode voltage, gas pressure, and working distance may be determined by one of ordinary skill in the art in accordance with one or more embodiments of the present invention readily without undue experimentation. Further, in accordance with one or more further embodiments, as will be described below, such determinations may be informed by reference to Paschen's law.

Paschen's law describes how breakdown voltage varies with gas pressure P and working distance d for uniform field electrode gaps, where the electric field in the gap is uniform and is given by V/d. Paschen's law reflects the Towsend breakdown mechanism in gases, and states that the breakdown characteristics of a gap are a function of the product of the gas pressure P and the working distance d (some modifications are necessary for highly electronegative gases because they recombine secondary electrons very quickly).

Much research has been done since the 1889 publication of Paschen's paper to provide a theoretical basis for the law, and to develop a greater understanding of the mechanisms of breakdown. However, many factors have an effect on the breakdown of a gap such as, for example, and without limitation, radiation, surface irregularities, and so forth. Thus, although the theoretical basis might help understand why a gap breaks down, it will not necessarily provide a more accurate value for the breakdown voltage in any given situation than that which is provided by the following. In general, an equation for breakdown is derived, and suitable parameters chosen, by fitting empirical data. For example, breakdown voltage $V_{bd}$ may be given by:

$V_{bd}=B*P*d/(C+\ln(P*d))$; where $C=\ln(A/\ln(1+1/\gamma))$; P is pressure; d is the gap or working distance between electrodes; $\gamma$ represents the efficiency of producing secondary electrons per ion hitting the electrode (it depends on the cathode material, and the ion and its energy which is determined, in turn, by the ratio of E/N—where E is the electric field and N is the gas particle density); and A and B are constants that depend on the particular gas. The equation for $V_{bd}$ may be used to generate a "Paschen curve" that gives the dependence of the breakdown voltage on the Pd product.

One can determine appropriate values of operation by routine experimentation as follows. First, chose a convenient working distance for the electron beam treatment apparatus. Next, select a value of cathode voltage that is determined by the energy of electrons required to treat a wafer. Next, while measuring the electron beam current (using, for example, a current detector disposed in series with high-voltage power supply 129), vary the gas pressure to sustain an effective, uniform electron beam. The current is measured to determine values of current that provide useful throughput (for example, and without limitation, electron beam current may range from about 1 mA to about 40 mA), and to ensure that the values of cathode voltage, gas pressure, and working distance used do not result in arcing or breakdown in generation and acceleration region 138 (breakdown may be evidenced by a faint plasma or arcing which can also be observed by voltage or current spiking at the cathode). Although it might seem desirable to operate at lower gas pressures to mitigate electron energy loss and/or beam directionality due to collisions in ionization region 138, we have found that is particular applications such as, for example, treatment of carbon-doped oxide ("CDO") films, the use of higher gas pressures does not measurably affect treatment results.

In accordance with one or more further embodiments of the present invention, useful values of gas pressure may be approximated by the requirement that the product of pressure and working distance fall below the Paschen curve for a particular gas, a particular cathode material, and a desired working distance.

Those skilled in the art will recognize that the foregoing description has been presented for the sake of illustration and description only. As such, it is not intended to be exhaustive or to limit the invention to the precise form disclosed. For example, although certain dimensions were discussed above, they are merely illustrative. In addition, the term substrate includes those suitable to be processed into an integrated circuit or other microelectronic device, and is used in the broadest sense of the work. Suitable substrates for the present invention non-exclusively include semiconductor materials such as gallium arsenide (GaAs), germanium, silicon, silicon germanium, lithium niobate and compositions containing silicon such as crystalline silicon, polysilicon, amorphous silicon, epitaxial silicon, and silicon oxide and combinations mixtures thereof. The term substrates also include glass substrates of any kind.

What is claimed is:

1. An electron beam treatment apparatus that comprises:
    (a) a chamber comprising:
        (i) a cathode having an exposed surface capable of producing electrons;
        (ii) an anode having holes, the anode spaced apart from the cathode by a working distance that is greater than a mean free path of the electrons produced by the cathode;
        (iii) a wafer holder facing the anode; and
        (iv) a gas inlet to admit gas into the chamber at a gas introduction rate;
    (b) a pump to exhaust gas from the chamber at a gas exhaust rate, the gas introduction rate and the gas exhaust rate providing a gas pressure in the chamber;
    (c) a source of negative voltage whose output is applied to the cathode to provide a cathode voltage; and
    (d) a source of voltage whose output is applied to the anode;
    wherein values of the cathode voltage, gas pressure in the chamber, and working distance are such that there is no arcing between the cathode and anode at the working distance that is greater than the mean free path of the electrons from the cathode.

2. The apparatus of claim 1 further comprising a source of gas comprising one or more of Ne, He, Ar, $H_2$, $O_2$, Kr, Xe, and $N_2$.

3. The apparatus of claim 1 wherein a material of the exposed surface of the cathode is selected from the group consisting of Al, Ti, Ni, Si, Mo, graphite, W, Co, and alloys of the foregoing.

4. The apparatus of claim 1 wherein a material of at least a surface of the anode is selected form the group consisting of Al, Ti, Ni, Si, Mo, graphite, W, Co, and of the foregoing.

5. The apparatus of claim 1 wherein the source of negative voltage is capable of providing output voltages in a range from about −5 KV to about −10 KV.

6. The apparatus of claim 1 wherein the pump provides a gas pressure that is greater than about 40 mTorr.

7. A method of treating a wafer with an electron beam in an electron beam treatment apparatus that includes a chamber; a cathode having an exposed surface inside the chamber that is capable of producing electrons; an anode having holes therein that is disposed inside the chamber and spaced apart from the cathode by a working distance; a wafer holder disposed inside the chamber facing the anode; a source of negative voltage whose output is applied to the cathode to provide a cathode voltage; a source of voltage whose output is applied to the anode; a gas inlet to admit gas into the chamber at a gas introduction rate from a source of the gas; and a pump to exhaust gas from the chamber at a gas exhaust rate, the gas introduction rate and the gas exhaust rat providing a gas pressure in the chamber, which method comprises:
    placing a wafer on the wafer holder;
    maintaining a working distance between the anode and the cathode that is greater than an electron mean free path of electrons produced by the cathode; and
    setting the source of negative voltage, the gas introduction rate, the gas exhaust rate, and the working distance to provide values of the cathode voltage, gas pressure, and working distance such that there is no arcing between the cathode and anode at the working distance that is greater than the mean free path of electrons from the cathode.

8. The method of claim 7 wherein the cathode voltage is in range from about −5 KV to about −10 KV.

9. The method of claim 8 wherein the gas comprises one or more of, Ne, He, Ar, $H_2$, $O_2$, Kr, Xe, and $N_2$.

10. The method of claim 7 wherein the gas pressure is greater than about 40 mTorr.

11. An electron beam treatment apparatus that comprises:
    (a) a chamber comprising:
        (i) a cathode capable of producing electrons, the cathode having an exposed surface area of from about 4 square inches to about 700 square inches;
        (ii) an anode having holes, the anode spaced apart from the cathode by a working distance in a range of from 10 to 20 mm;
        (iii) a wafer holder facing the anode; and
        (iv) a gas inlet to admit gas into the chamber at a gas introduction rate;
    (b) a pump to exhaust gas from the chamber at a gas exhaust rate, the gas introduction rate and the gas exhaust rate providing a gas pressure in the chamber;
    (c) a source of negative voltage whose output is applied to the cathode to provide a cathode voltage; and
    (d) a source of voltage whose output is applied to the anode.

12. The apparatus of claim 11 further comprising a source of gas comprising one or more of Ne, He, Ar, $H_2$, $O_2$, Kr, Xe, and $N_2$.

13. The apparatus of claim 11 wherein a material of the exposed surface area of the cathode is selected from the group consisting of Al, Ti, Ni, Si, Mo, graphite, W, Co, and alloys of the foregoing.

14. The apparatus of claim 11 wherein a material of at least a surface of the anode is selected from the group consisting of Al, Ti, Ni, Si, Mo, graphite, W, Co, and alloys of the foregoing.

15. The apparatus of claim 11 wherein the source of negative voltage is capable of providing output voltages in a range from about −5 KV to about −10 KV.

16. The apparatus of claim 11 wherein the gas pressure is greater than about 40 mTorr.

17. The apparatus of claim 11 wherein the wafer holder is for a 300 mm wafer.

* * * * *